United States Patent [19]

Terakado et al.

[11] Patent Number: 5,221,037
[45] Date of Patent: Jun. 22, 1993

[54] WIRE BONDING METHOD AND APPARATUS

[75] Inventors: Yoshimitsu Terakado; Kazuo Sugiura, both of Tokyo, Japan

[73] Assignee: Kabushiki Kaisha Shinkawa, Tokyo, Japan

[21] Appl. No.: 927,850

[22] Filed: Aug. 10, 1992

[30] Foreign Application Priority Data

Aug. 8, 1991 [JP] Japan .................. 3-223447

[51] Int. Cl.⁵ .......................... H01L 21/607
[52] U.S. Cl. .................. 228/102; 228/110; 228/1.1; 228/8
[58] Field of Search .......... 228/102, 110, 111, 179, 228/1.1, 4.5, 8

[56] References Cited

U.S. PATENT DOCUMENTS

| | | | |
|---|---|---|---|
| 3,610,506 | 10/1971 | Robinson | 228/1.1 |
| 3,873,859 | 3/1975 | Shoh | 228/1.1 |
| 4,373,653 | 2/1983 | Salzer et al. | 228/110 |
| 4,496,095 | 1/1985 | Renshaw et al. | 228/111 |
| 4,603,802 | 8/1986 | Kurtz et al. | 228/1.1 |
| 4,854,494 | 8/1989 | von Raben | 228/1.1 |
| 5,078,312 | 1/1992 | Ohashi et al. | 228/1.1 |
| 5,111,989 | 5/1992 | Holdgrafer et al. | 228/110 |

FOREIGN PATENT DOCUMENTS 57-87143 5/1982 Japan .
1-26531 5/1989 Japan .

*Primary Examiner*—Samuel M. Heinrich
*Attorney, Agent, or Firm*—Koda and Androlia

[57] ABSTRACT

In wire bonding performed in assembling, for example, semiconductor devices, the joining or bonding strength between a ball formed at an end of bonding wire and a bonding point is brought to a satisfactory level because of the use of small diameter balls with a little variation in diameter, and the bonding is performed by setting a load, that is applied on the ball when the ball contacts the bonding point, is set larger than when the ultrasonic waves are applied onto the ball.

4 Claims, 6 Drawing Sheets

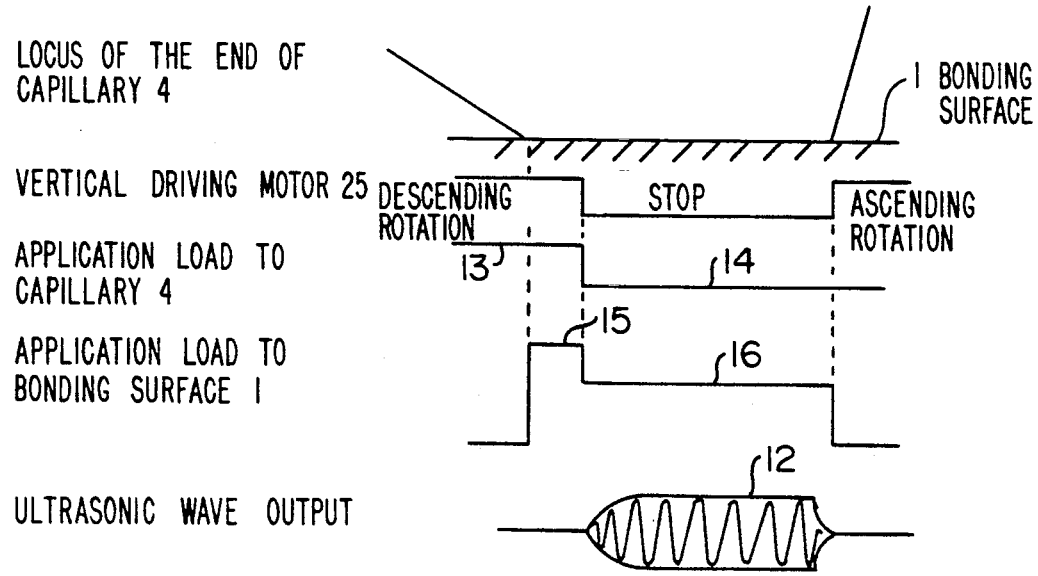
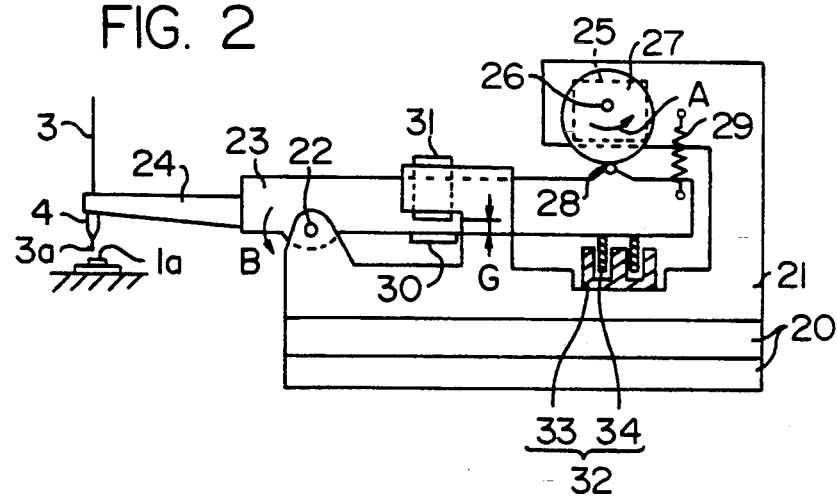

FIG. 5(a)  FIG. 5(b)  FIG. 5(c)  FIG. 5(d)
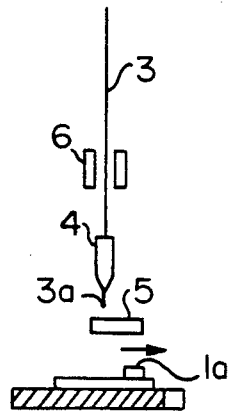 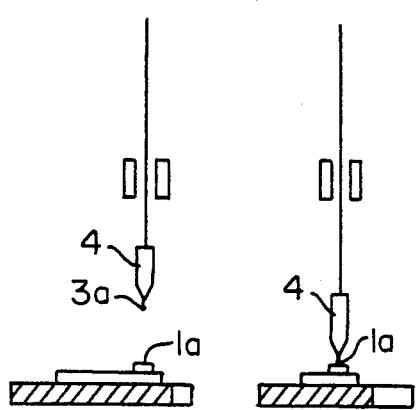 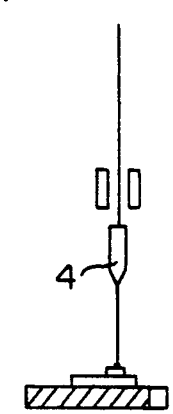
FIG. 5(e)  FIG. 5(f)  FIG. 5(g)
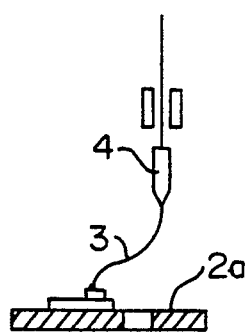 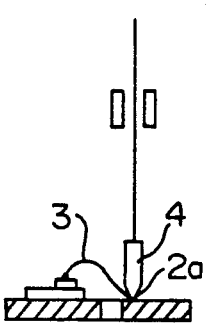 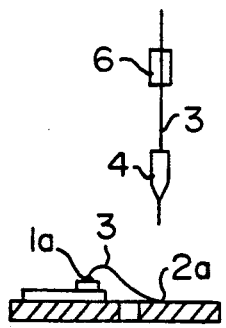

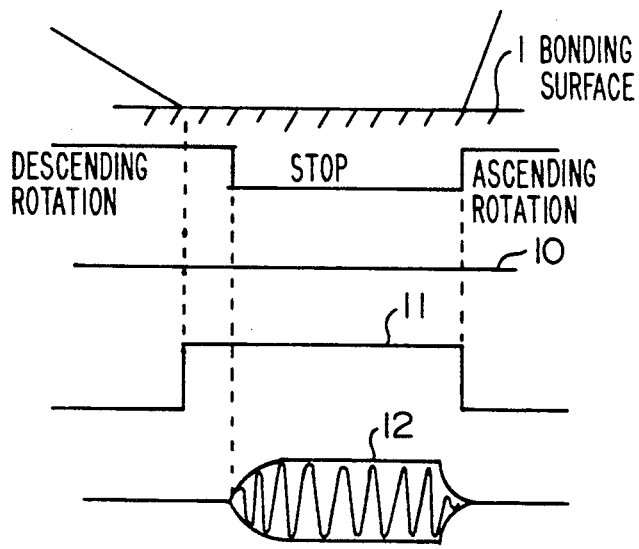
FIG. 6
LOCUS OF THE END OF CAPILLARY 4
VERTICAL DRIVING MOTOR
APPLICATION LOAD TO CAPILLARY 4
APPLICATION LOAD TO BONDING SURFACE
ULTRASONIC WAVE OUTPUT
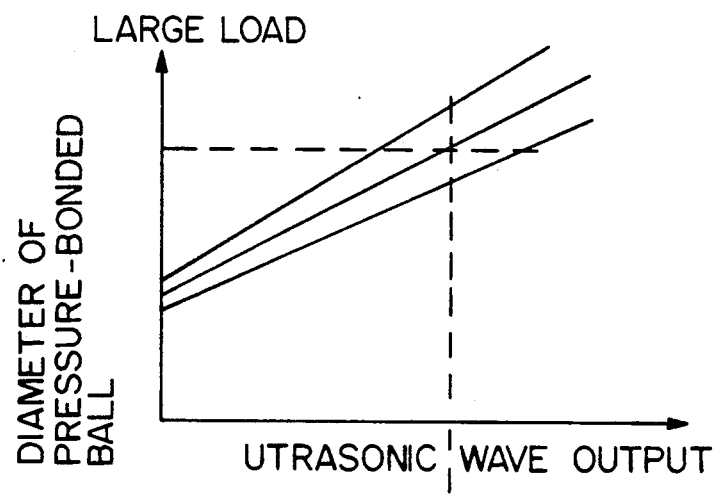
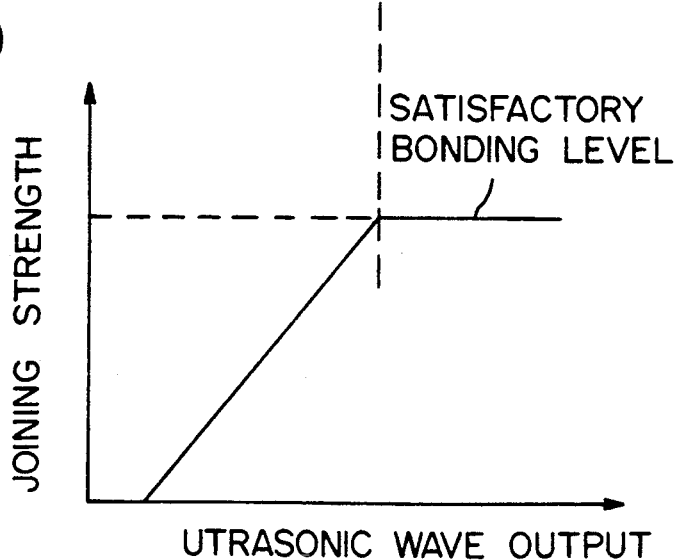
FIG. 7(a)

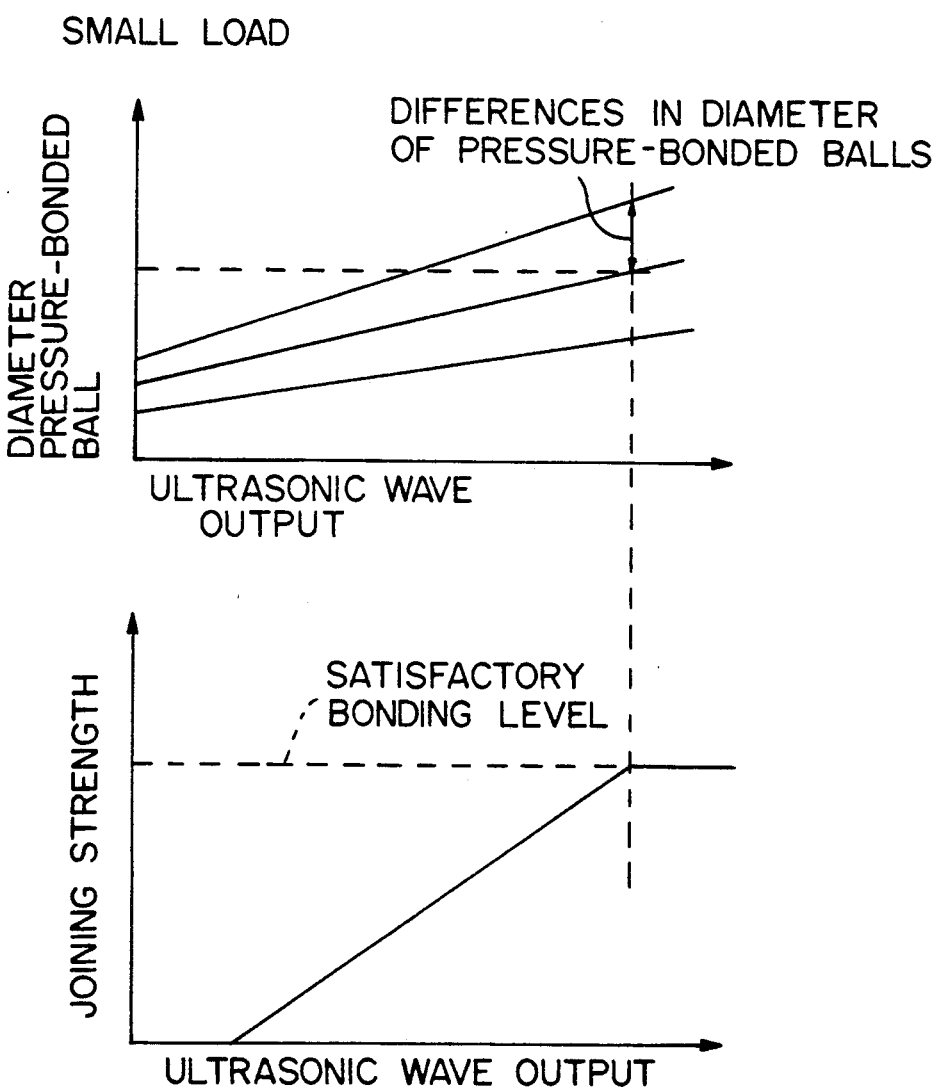

WIRE BONDING METHOD AND APPARATUS

BACKGROUND OF THE INVENTION

1. Field of the Invention

The present invention relates to a method and apparatus for wire-bonding a first bonding point and a second bonding point.

2. Prior Art

Wire bonding method is performed, for example, as shown in FIGS. 5(a) through 5(g).

First, as shown in FIG. 5(a), a spark discharge of an electric torch 5 makes a ball 3a at the end of a wire 3 extending out of the lower end of a capillary 4. Then, the electric torch 5 moves away in the direction indicated by the arrow.

Next, as shown in FIG. 5(b), the capillary 4 is moved to a point above the first bonding point 1a and then lowered as shown in FIG. 5(c). The ball 3a at the end of the wire 3 is connected to the first bonding point 1a.

Afterward, as shown in FIG. 5(d), the capillary is raised and, as shown in FIG. 5(e), and moved to a point located above the second bonding point 2a. Then, the capillary 4 is lowered as shown in FIG. 5(f), and the wire 3 is bonded to the second bonding point 2a.

Next, the capillary 4 is raised to a predetermined position, a clamper 6 is closed, then the capillary 4 and the clamper 6 are raised together so that the wire 3 is cut as shown in FIG. 5(g).

With the steps described above and shown in FIGS. 5(a) through 5(f), one wire connection is completed.

Japanese Patent Application Laid-Open (Kokai) No. 57-87143 and Japanese Patent Application Publication (Kokoku) No. 1-26531, etc. are examples of this wire bonding method.

As seen from the above, in these prior art, the ball 3a is pressure-bonded (thus, the bonded ball 3a is called "pressure-bonded ball" hereinafter) to the first bonding point 1a; therefore, the relationship between the shape of the pressure-bonded ball and the bonding surface is a critical factor for a satisfactory joining or bonding.

In the prior art, as shown in FIG. 6, the capillary 4 is kept under a constant load 10, and an application load 11 is applied to a first bonding surface when the capillary 4 is in contact with the first bonding point. With this application load 11 being applied, an ultrasonic wave 12 is applied to the first bonding point.

In the prior art described above, however, no consideration is given to the application load 11 which affects the diameter of the pressure-bonded ball. The inventor of the present application conducted extended tests on the application load to find out the diameters of pressure-bonded balls which can provide a satisfactory joining (or bonding) strength.

The tests indicate that if the bonding surface application load 11 is large, the diameter of the pressure-bonded ball which has a satisfactory joining strength is large, but the differences in diameters of the pressure-bonded balls is small as shown in FIG. 7(a). On the other hand, if the application load 11 is small, the diameter of the pressure bonded ball which has a satisfactory joining strength is relatively small, but the differences in the pressure-bonded ball diameter is large as shown in FIG. 7(b).

Thus, if the pressure-bonded ball 3a is deformed by a large application load 11 before applying the ultrasonic waves, the pressure-bonded ball diameter can be consistent but the diameter becomes large, because the application load 11 during the application of the ultrasonic waves becomes to be excessive. On the other hand, if the application load 11 is small, the deformation of the pressure-bonded ball 3a before applying the ultrasonic waves is too small and not consistent in shape, but the diameter becomes small.

In other words, in the prior art, it is almost impossible to obtain an appropriate pressure bonded ball diameter and to minimize the differences of the pressure-bonded ball diameters.

In recent years, the semiconductor assembling devices have demanded a more and more precise and detailed work. As a result, it is very important to accomplish bonding with a minimal pressure-bonded ball and to reduce the differences or variation in the pressure-bonded ball diameter.

SUMMARY OF THE INVENTION

The object of the present invention is to provide a wire bonding method and apparatus with which a satisfactory joining strength in bonding is obtained from small diameter pressure-bonded balls with minimal diameter differences.

The object of the present invention is accomplished by a unique method which is utilized in a method in which a bonding to a first bonding point is performed via ultrasonic waves while a load is being applied to a ball formed at an end of a bonding wire, and the unique method of the present invention is that the load upon the ball when the ball comes into contact with the first bonding point is set greater than the load which is applied when the ultrasonic waves are applied.

The object of the present invention is also accomplished by a unique structure for a wire bonding apparatus which performs bonding to a first bonding point with ultrasonic waves while applying a load onto the first bonding point, and the unique structure of the present invention is that the bonding apparatus includes a detection means which detects a point where the ball comes into contact with the first boding point, a bonding load setting means which sets a bonding load to be applied to the ball, and a central control circuit which outputs a signal to the bonding load setting means so that the load on the ball which is in contact with the first bonding point is larger than the load when the ultrasonic wave is applied to the ball.

The unique method and structure of the present invention described above are obtained from the tests and experiments the inventors performed. As a result of the tests and experiments, in the present invention, a large scale of load is placed on the ball before the ultrasonic waves are applied to the ball; by doing so, the diameter of the pressure bonded balls can be constant in size without causing diameter differences. In addition, since a smaller load is applied on the ball during the application of the ultrasonic waves, the diameter of the pressure-bonded ball does not become larger but remains relatively small.

BRIEF DESCRIPTION OF THE DRAWINGS

FIG. 1 is a timing chart used in one embodiment of the wire-bonding method of the present invention;

FIG. 2 is a schematic diagram of a wire-bonding apparatus which utilizes the method of FIG. 1;

FIGS. 5(a) through 5(g) show the process of the wire-bonding method;

FIG. 6 is a timing chart used in the prior art wire-bonding method; and

FIG. 7 shows the pressure-bonded ball diameter and diameter differences obtained by the prior art method in which FIG. 7(a) illustrates a large load, and FIG. 7(b) illustrates a small load.

DETAILED DESCRIPTION OF THE INVENTION

Figure 3:
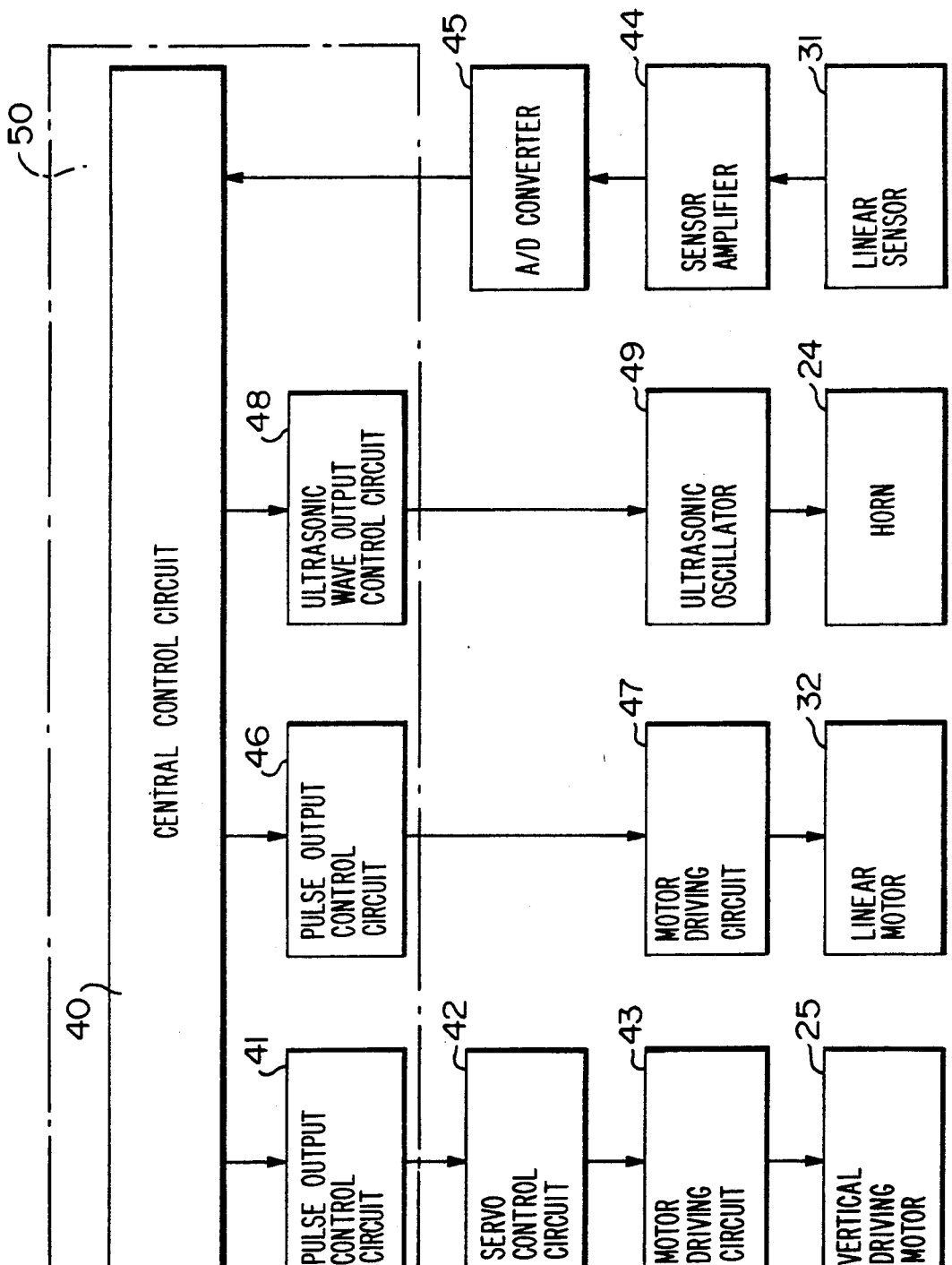
FIG. 3 is a block diagram of the control device used in the wire-bonding apparatus shown in FIG. 2.

One embodiment of the present invention will be described below with reference to FIGS. 1 through 4:

As shown in FIG. 2, a bonding head 21 is mounted on an XY table 20. A supporting shaft 22 is rotatably mounted on the bonding head 21, and a horn holder 23 is mounted to the supporting shaft 22. A horn 24 is attached to the front end of the horn holder 23, and a capillary 4 is attached at the tip end of the horn 24. The end of a wire 3 which is on a spool (not shown) is brought to pass through the capillary 4.

A vertical driving motor 25 which is capable of making a forward and reverse rotation is mounted on the bonding head 21. A cam shaft 26 is attached to the output shaft of the motor 25, and a cam 27 is attached to the cam shaft 26. The horn holder 23 is urged by a spring 29 at its root end so that a cam follower 28, which is a roller rotatable on the horn holder 23, is pressed against the cam 27.

A detection plate 30 is attached to the undersurface of the horn holder 23 on the opposite side of the supporting shaft 22 from the capillary 4. The detection plate 30 projects over the side surface of the horn holder 23. A linear sensor 31 is mounted on the bonding head 21 in a manner so as to face the upper surface of the projected portion of the detection plate 30.

The magnet 33 of a linear motor 32 which is used to set a bonding load is fixed to the bonding head 21, and the coil 34 of the linear motor 32 is fixed to the horn holder 23.

The cam 27 is a linear or eccentric cam and has a dropping profile for a 180-degree rotational range in the direction indicated by arrow A starting from the position shown in FIG. 2. In other words, the cam 27 is rotated in the forward and reverse directions in such a 180-degree range from the position shown in FIG. 2. Thus, the cam 27 provides a dropping profile when it rotates in the forward direction (the arrow A direction) and a rising profile when it rotates in the reverse direction.

Accordingly, when the cam 27 is rotated in the forward direction, the dropping profile of the cam 27 causes the horn holder 23 to swing about the supporting shaft 22 in the direction of arrow B to descend the capillary 4. When the capillary 4 descends, the gap G between the detection plate 30 and the linear sensor 31 changes a great deal in accordance with the amount of swing motion of the horn holder 23, and a voltage or current which is proportional to the changed amount of the gap G is outputted from the linear sensor 31. After the capillary 4 has descended and come into contact with the bonding point 1a, the gap G remains the same. Accordingly, at this time a constant voltage or current is outputted from the linear sensor 31. When a constant voltage or current is outputted from the linear sensor 31, this output is taken as an element which represents the level of the bonding surface by a central control circuit 40 (shown in FIG. 3), and the detection point (of the bonding surface) is stored in the memory of the central control circuit 40.

FIG. 3 illustrates a control means. The vertical driving motor 25 is driven via a pulse output control circuit 41, a servo control circuit 42 and a motor driving circuit 43 based upon data stored beforehand in the central control circuit 40. The amount of forward rotation and the amount of reverse rotation of the motor 25 are thus controlled. Furthermore, the rotational amount of the vertical driving motor 25 in this case is read into the central control circuit 40 and servo control circuit 42.

The output of the linear sensor 31, which corresponds to the amount of the gap G that is detected between the detection plate 3 and the linear sensor 31 when the capillary 4 is lowered by the rotation of the vertical driving motor 25, is successively amplified by a sensor amplifier 44, converted into digital data by an A/D converter 45, and inputted into the central control circuit 40. The linear motor 32 is driven via a pulse output control circuit 46 and a motor driving circuit 47 on the basis of the data from the central control circuit 40.

As shown in FIG. 1, the central control circuit 40 is designed so that a large application load 13 is applied on the capillary 4 before the ultrasonic wave 12 is outputted to the capillary 4, and so that a small application load 14 is applied to the capillary 4 after the output of the ultrasonic wave 12 has started to be applied to the capillary 4.

Back to FIG. 3, the ultrasonic wave 12 is outputted (or applied) to the horn 24 via an ultrasonic wave output control circuit 48 and an ultrasonic oscillator 49. The central control circuit 40, the pulse output control circuits 41 and 46 and the ultrasonic wave output control circuit 48 may be replaced by a microcomputer 50.

The operation of the above embodiment will be described below. Bonding steps are substantially the same as the one shown in FIG. 5, and bonding actions only on the first bonding point 1a will be described.

After a ball 3a is formed at the tip of the wire 3, the vertical driving motor 25 shown in FIG. 2 is rotated in the forward direction (in the direction of arrow A). In this case, an output is sent from the central control circuit 40 to the linear motor 32 so that a large application load 13 (see FIG. 1) is applied to the capillary 4. More specifically, a predetermined value of constant current is applied to the linear motor 32; this results in that the coil 34 is repelled by the magnet 33 so that the root side of the horn holder 23 is pushed up, thus causing the cam follower 28 to press against the cam 27. The large application load 13 is thus applied to the capillary 4.

As described above, when the vertical driving motor 25 is rotated in the forward direction, the capillary 4 is lowered as shown in FIG. 1, and the ball 3a comes into contact with the first bonding point 1a of the bonding surface 1 (also see FIG. 5(c)). When this occurs, the output of the linear sensor 31 becomes to remain the same, and the central control circuit 40 stores the level of the bonding surface 1. Using the detection point of the level of the bonding surface 1 as a reference, the vertical driving motor 25 is rotated by a fixed amount. As a result, a gap is created between the cam 27 and the cam follower 28, and a large application load 15 caused by the load 13 is applied onto the capillary 4. Thus, the ball 3a is flattened by the capillary 4.

Next, the ultrasonic oscillator 49 is caused to output the ultrasonic wave 12 which is transmitted to the capillary 4 through the horn 24. The ball 3a is bonded to the first bonding point 1a by the ultrasonic waves. Simultaneously with the start of the output of the ultrasonic wave 12 or roughly about the same time as such an output of the ultrasonic wave 12, a current which is smaller than the current described above flows to the linear motor 32 so that an application load 14 which is smaller than the application load 13 is applied to the capillary 4. As a result, the ball 3a being applied with a small application load 16 (which is caused by the load 14) is bonded to the first bonding point 1a by the ultrasonic wave output 12.

Afterward, the vertical driving motor 25 is rotated in the reverse direction, and the capillary 4 is raised by the rising profile of the cam 27.

Figure 4:
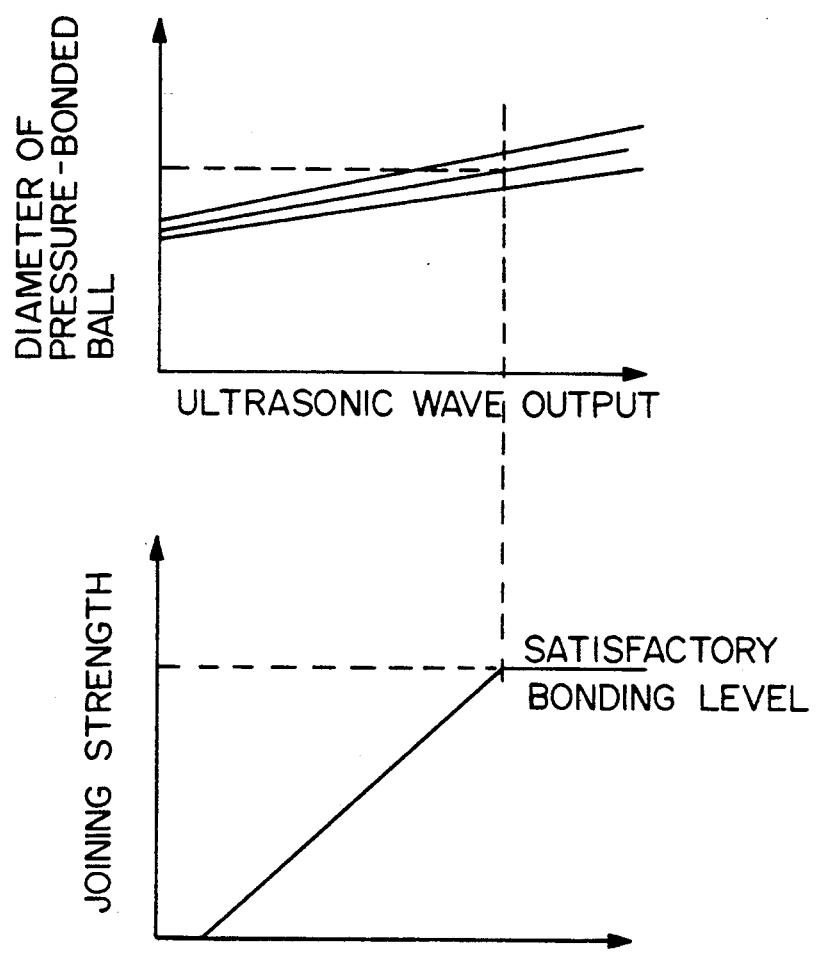
FIG. 4 is an explanatory diagram of the pressure-bonded ball diameter and differences in diameter obtained by the method of the present invention.

As described above, since the application load 15 that is applied when the ball 3a contacts the first bonding point 1a is set larger than the application load 16 that is applied during the application of the ultrasonic wave output 12, as shown in FIG. 4, the diameters of the pressure-bonded balls are small and there is almost no difference in the diameter of the pressure-bonded balls to obtain the satisfactory joining strength. The reason for this appears to be as follows: since the large application load 15 is applied prior to the application of the ultrasonic waves, the pressure-boned ball is constant in diameter with a little difference; on the other hand, since the small application load 16 is applied during the application of the ultrasonic waves, the diameter of the pressure-bonded balls does not become large but can remain relatively small.

The magnitudes of the application load 15 (the load before the ultrasonic wave application starts) and the application load 16 (the load after the ultrasonic wave application has started) can vary depending upon the material and diameter of the wire 3 and also upon the magnitude of the ultrasonic wave 12, etc. For example, if the application load 15 is set at 60 gr and the application load 16 is set at 30 gr, a satisfactory joining strength is obtained from the 80 micron diameter pressure-bonded ball with the diameter differences of ±3 microns, under the following conditions:

Material of the wire 3 = gold
Diameter of the wire 3 = 30 microns
Output of Ultrasonic wave 12 = 60 mW
Application time of the load 15 = 7 ms, and
Application times of the load 16 and ultrasonic wave 12 = 15 ms As seen from the above, according to the present invention, the load applied when the ball at the end of bonding wire contacts a first bonding point is set larger than the load applied during the application of the ultrasonic waves. Therefore, the joining strength reaches the satisfactory level with a small pressure bonded ball diameter with a little difference in the pressure-bonded ball diameter.

We claim:

1. A wire-bonding method in which a ball formed at an end of a bonding wire is bonded to a bonding point via ultrasonic waves while applying a load onto said ball, said method being characterized in that a load at a time when said ball contacts said bonding point is controlled to be substantially greater than a load applied subsequently during the time said ultrasonic waves are applied.

2. A wire bonding apparatus which perform bonding to a bonding pint with ultrasonic waves while applying a load onto said bonding point, comprising:
   a detection means which detects a point where a ball formed at an end of bonding wire comes into contact with said bonding point,
   a bonding load setting means which sets a bonding load to be applied to said ball, and
   a central control circuit which output a control signal to said bonding load setting means so that said load on said ball which is in contact with the first bonding point is caused to be substantially larger than a load which is subsequently applied when said ultrasonic waves are applied to said ball.

3. A wire-bonding method in which a ball formed at an end of a bonding wire is bonded to a bonding point via ultrasonic waves while applying a load onto said ball, said method being characterized in that a load applied onto said ball before said ultrasonic wave si applied to said ball is controlled to be substantially set greater than a load which is subsequently applied during the time said ultrasonic wave is applied.

4. A wire bonding apparatus according to claim 2, wherein the load on said ball which is contact with the first bonding point is twice as large as the load subsequently applied when aid ultrasonic waves are applied to said ball.

* * * * *